United States Patent [19]
Geryk

[11] Patent Number: 6,166,441
[45] Date of Patent: Dec. 26, 2000

[54] METHOD OF FORMING A VIA OVERLAP

[75] Inventor: Nathan Geryk, Gilbert, Ariz.

[73] Assignee: Intel Corporation, Santa Clara, Calif.

[21] Appl. No.: 09/191,462

[22] Filed: Nov. 12, 1998

[51] Int. Cl.[7] .......................... H01L 23/48; H01L 23/52; H01L 29/40
[52] U.S. Cl. ........................ 257/773; 257/786; 257/774
[58] Field of Search .................................. 257/774, 786, 257/776, 773

[56] References Cited

U.S. PATENT DOCUMENTS

| | | |
|---|---|---|
| 4,196,443 | 4/1980 | Dingwall . |
| 4,951,101 | 8/1990 | Alter et al. . |
| 5,432,381 | 7/1995 | Melzner . |
| 5,508,564 | 4/1996 | Lee et al. . |

*Primary Examiner*—Sheila V. Clark
*Attorney, Agent, or Firm*—Howard A. Skaist

[57] ABSTRACT

Briefly, in accordance with one embodiment of the invention a method of forming at least two vias, each having a metal overlap, to interconnect at least two connection points with metallization includes the following. The at least two vias are etched through a layer of insulating material. The at least two etched vias are located diagonally with respect to one another. Metal overlap for each of the at least two vias is formed into a polygon shape having more than four sides.

Briefly, in accordance with another embodiment of the invention, an article includes: a storage medium, the storage medium having stored thereon, instructions, which, when executed, result in: the placement and routing of vias between at least two connection points to be interconnected with metallization by positioning at least two vias diagonally with respect to one another, the at least two vias being positioned so each is capable of having a polygon shape of metal overlap with more than four sides.

Briefly, in accordance with still another embodiment of the invention, an integrated cicuit includes: a semiconductor substrate, the semiconductor substrate having formed thereon an interconnect. The interconnect including at least two vias, the at least two vias being located diagonally with respect to one another and each having a metal overlap with a polygon shape of more than four sides.

4 Claims, 3 Drawing Sheets

METAL-TO-METAL
DESIGN RULES = 0.52 μm

METAL-TO-METAL
DESIGN RULES = 0.52 μm

METAL 1 & METAL 2 OVERLAP

METAL 1 & METAL 2 OVERLAP

METAL 1 RUNS ↕

METAL 2 RUNS ↔

METHOD OF FORMING A VIA OVERLAP

BACKGROUND

1. Field

The present invention is related to semiconductor or silicon fabrication technology, and, more particularly, to forming a via overlap.

2. Background Information

As is well-known, in the process of forming an integrated circuit chip, typically, layers are formed on top of a semiconductor substrate. Of course, although silicon is typically employed, other semiconductors, such as germanium or gallium arsenide, may, of course, be used. The layers typically include an insulating material, such as oxide, with metal routing or metallization being employed to interconnect different transistors or other components embedded in the silicon. Additional background information about semiconductor fabrication technology is provided, for example, in "CMOS Processing Technology," Chapter 3 of *Principles of CMOs VLSI Design,* by Neil Weste and Kamran Eshraghian, available from Addison-Wesley Publishing Company, Second Edition, 1993.

In order to form the metal interconnect, holes are formed through the oxide in order to contact portions of the components or transistors, such a polysilicon gate or landing site, for example. These holes are referred to as vias. In designing or laying out such chips, the density of the chip is affected, at least in part, by how well the metal lines and vias are distributed to interconnect the components or the transistors. It is desirable to have the interconnect portion of the chip be as dense with metal routing as is feasilbe. The higher the density of the metal routing, the less power employed to drive the circuitry, due to shorter metal lines, that reduce the resistance and capacitance associated with the metal. Likewise, a more dense metal interconnect may reduce the size of the die, which reduces cost and silicon. Therefore, it is desirable to continue to come up with techniques to fabricate integrated circuit chips that result in higher density interconnects.

SUMMARY

Briefly, in accordance with one embodiment of the invention, a method of forming at least two vias, each having a metal overlap, to interconnect at least two connection points with metallization includes the following. The at least two vias are etched through a layer of insulating material. The at least two etched vias are located diagonally with respect to one another. Metal overlap for each of the at least two vias is formed into a polygon shape having more than four sides.

Briefly, in accordance with another embodiment of the invention, an article includes: a storage medium, the storage medium having stored thereon, instructions, which, when executed, result in: the placement and routing of vias between at least two connection points to be interconnected with metallization by positioning at least two vias diagonally with respect to one another, the at least two vias being positioned so each is capable of having a polygon shape of metal overlap with more than four sides.

Briefly, in accordance with still another embodiment of the invention, an integrated cicuit includes: a semiconductor substrate, the semiconductor substrate having formed thereon an interconnect. The interconnect including at least two vias, the at least two vias being located diagonally with respect to one another and each having a metal overlap with a polygon shape of more than four sides.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

Figure 1:
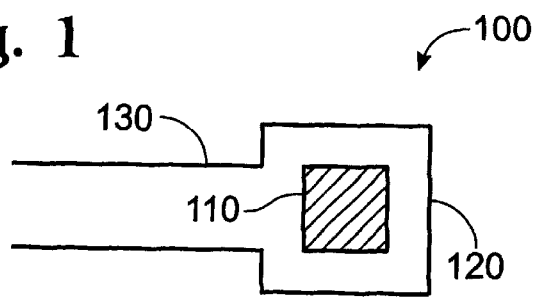
FIG. 1 is a diagram showing a plan view of the appearance of a via with a traditional square metallization overlap.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously described, a greater density metal interconnect is desirable in order to reduce the size of the chips as well as to reduce power when energy is applied to the chip. Today, the layout of metal lines or the metallization and vias, is performed using computer-aided design (CAD) and computer-aided manufacturing (CAM) design tools. Typically, these tools execute on a system, such as a computer or similar computing platform, in which the circuit designer or other technical personnel designs logic cells to be fabricated into silicon. Once the logic cells are designed, CAD/CAM tools are then further employed to automatically place and route interconnections between these cells in order to produce the layout for the overall integrated circuit chip. The systems or tools employed to perform this operation are often referred to as automatic placement and routing or APR systems or tools. A tape is usually produced that contains a data set and/or other electronically stored information, which is used by equipment employed to process the silicon, and directs the operations of the equipment to produce the chip.

Typically, at least two approaches may be employed in the computer-aided design of these integrated circuit chips. In one approach, each of the cells are individually customized in design using such computer tools and then the cells are interconnected using APR tools, as previously described. Another approach that may be employed is where the layout of the silicon is determined before the metallization routing is determined. In this approach, gate-array architectures are embodied on the silicon that are standard arrays of transistors that may be designed, given the appropriate metallization, to form many different types of circuits. Therefore, while the silicon is being fabricated in a manufacturing facility to produce the gate arrays of transistors in the silicon, the design of the remaining portion of the chip, such as the portion interconnecting the transistors, continues to occur. The second approach, although resulting in a less customized chip, has the advantage of shorter turn around time in terms of chip production because, while portions of the chip are being manufactured, the remaining portion of the chip is still being designed. Thus, the overall time to design and manufacture the chip is reduced. For the gate array approach to chip design, as with the customized, or as it is sometimes referred to, the standard cell approach, once the gate-array cells are appropriately designed, again, an APR tool is employed to interconnect the metallization of the different cells. Thus, the scope of the present invention is not limited to either of these approaches and, therefore, embodiments of the invention may be employed in both of these, or even other, design techniques. Additional information about various design techniques is provided, for example, in "CMOS Design Methods," Chapter 6 of the aforementioned *Principles of CMOS VLSI Design,* by Neil Weste and Kamran Eshraghian.

FIG. 1 is diagram illustrating the plan view of a via in the horizontal surface of an integrated circuit chip, after the via and metal overlay have been formed. As illustrated, in the industry, vias are formed as rectangular or square cuts in an insulating layer formed on the chip, typically made of oxide material. In FIG. 1 the via is designated as 110. Likewise, typically, a square or rectangular metal overlap or coverage is applied above and below the via on the horizontal surface, illustrated in FIG. 1 as 120. Likewise, the via hole itself is typically filled with a metal material. Although the invention is not limited in scope in this respect, commonly, the via is filled with a material, such as titanium or tungsten, whereas the metal overlap is formed from aluminum. Furthermore, a metal line 130, also typically formed of aluminum, illustrated in FIG. 1, is in direct physical contact with metal overlap 120.

Figure 2:
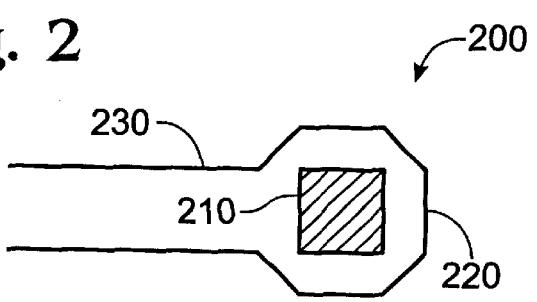
FIG. 2 is a diagram showing a plan view of the appearance of a via with an octagon shaped metal overlap in accordance with an embodiment of the invention.

FIG. 2 illustrates an embodiment of a via overlap in accordance with the present invention. Although the invention is not limited in scope in this respect, in this particular embodiment, as also previously described with respect to FIG. 1, the via itself is rectangular or square shaped. Nonetheless, the metal overlap in this particular embodiment has an octagon shape. Of course, the invention is not limited in scope to an octagon-shaped overlap, as explained in more detail later.

The invention is, of course, not limited in scope to a particular technique employed to form the vias. However, typically, after the semiconductor substrate has been formed to provide transistors, and, after a gate oxide and polysilicon has been applied and formed on the silicon, an insulating material, typically referred to as a field oxide, is applied, although the invention is not limited in scope in this respect. Typically, a via is etched in the field oxide using any one of a number of known etching techniques, so that a through hole is formed and so that metal may be applied to the via hole in order to be in direct contact with a portion of an underlying component embedded in the silicon, such as the polysilicon gate of a transistor, for example, or in contact with another layer of metal below the layer being applied, as described in more detail hereinafter. Of course, the invention is not limited in scope to interconnecting transistors or to employing polysilicon or gate oxides in the fabrication of the underlying component. The previous description is provided merely as one example of a typical fabrication technique that may be employed in the process of forming an integrated circuit chip.

Figure 3:
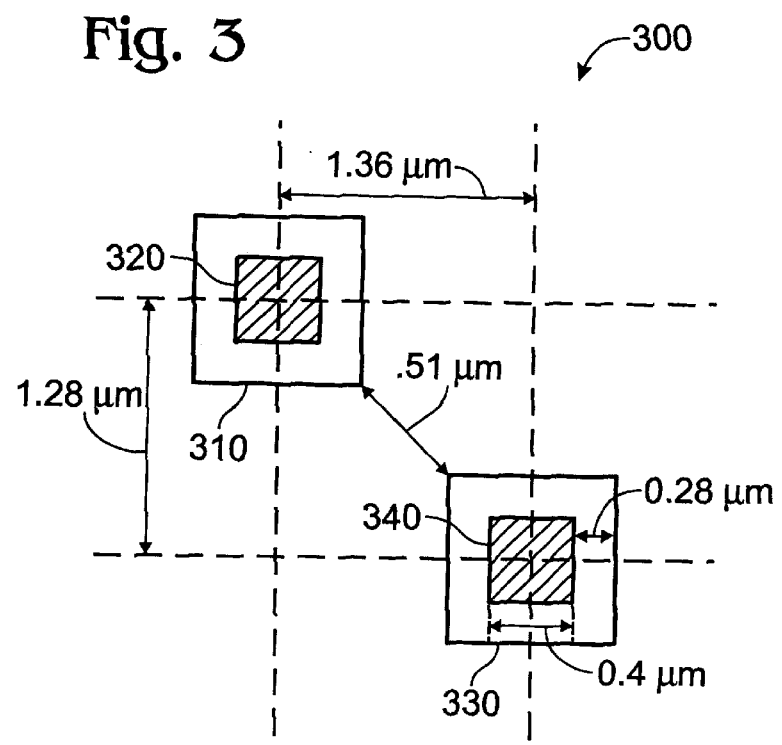
FIG. 3 is a diagram illustrating a plan view of two vias located diagonally with respect to one another, the vias having square metal overlaps.

As previously described, typically an APR tool or system is employed in order to interconnect cells, pins, nodes or connection points. Typical a cell has more than one pin or connection point. Therefore, two vias might, for example, connect different pins or connection points within the same cell, such as either customized or standard cells, or cells that have been formed from gate arrays of transistors. Regardless, as is well-known, process design rules are typically employed that dictate the minimum distance between metal overlaps covering vias that are adjacent. Also, as indicated in FIG. 3, for example, the process design rules will typically dictate the minimum metal overlap of the via, 0.28 mircons in this example. This is due at least in part to limitations in photolithography, etching etc. Where an automated tool, such as an APR system, is being employed to interconnect cells, such vias are located or placed on a grid system with respect to one another and such process design rules also dictate that one side of the via lie flat with respect to the X axis and not be tilted. However, typically, the design rules do not dictate the shape of the metal overlap or indicate that the shape be the same as the that of the via itself. Therefore, as illustrated by a comparison of FIG. 1 and FIG. 2, a via having a polygon shape other than a square or rectangle, such as for example, in FIG. 2, an octagon shape, saves unnecessary metal. Therefore, the metal overlap in FIG. 1 has unnecessary metal overlap on the corners. Furthermore, by using less metal overlap at the corners, as described in more detail below, tighter routing of vias may be accomplished in the chip.

Of course, as with etching a via, forming a metal overlap may be accomplished by any one of a number of techniques. Typically, although the invention is not limited in scope in this respect, after the via has been etched, a metal layer is deposited over the entire surface of the integrated circuit chip. Then, using common photolithographic techniques, major portions of the metal layer may be removed or etched to form the desired metal overlap shapes around the vias as well as metal lines interconnecting the vias, as desired to accomplish routing. The invention is not limited in scope to any particular technique of depositing metal, to any particular type of metal, or to any particular technique for removing the metal in order to form the desired shapes and metal routing.

FIG. 3 is a schematic diagram illustrating a routing grid in which two vias are located diagonally with respect to one another and in which square or rectangular metal overlaps are employed. As illustrated, the two vias are positioned as located on a rectangular grid. As previously described, typically, these vias are positioned using an automatic placement and routing tool. As illustrated in FIG. 3, the vias are located so that the horizontal and vertical distances between their centers are in the range of approximately one to two microns. For example, although the invention is not limited in scope in this respect, the horizontal distance between the centers of the vias is 1.36 microns and the vertical distance is 1.28 microns. Nonetheless, as illustrated by this example, because the diagonal distance between the corners of the metal overlap in this example is 0.51 microns, this would violate a design rule for this example in that the metal from the overlap would be placed too closely and, therefore, the automatic placement and routing tool would not position the vias in this manner. In this particular example, the design rule spacing is assumed to be no closer than 0.52 microns from metal to metal. Typically, design rules limiting the placement of the metal with respect to one another, such as the overlap, is to ensure that short circuits and/or open circuits do not occur due at least in part to limitations in the precision of the photolithography and/or etching techniques employed to form the metallization, as previously described. Of course, alternatively, to meet the 0.52 spacing design rule using square vias, one might reduce the 0.28 um overlap of the via to, for example, a 0.24 um overlap. But this, of course, would violate the 0.28 metal overlap of via and could potentially result in undesirable opens/shorts, etc.

Figure 4:
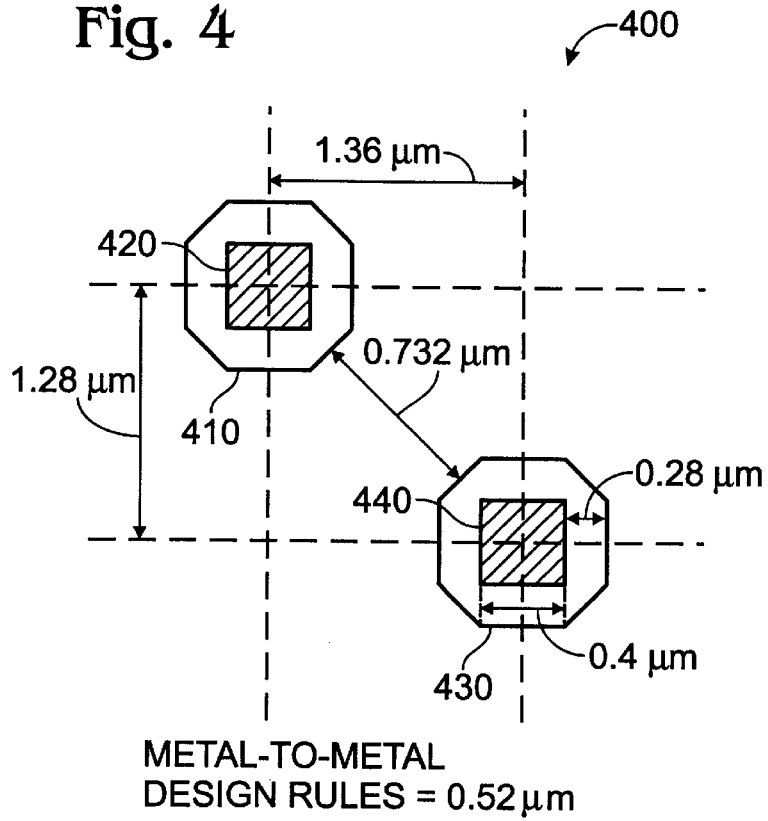
FIG. 4 is a diagram illustrating a plan view of two vias located diagonally with respect to one another, the vias having octagon shaped metal overlaps in accordance with an embodiment of the invention.
Figure 7:
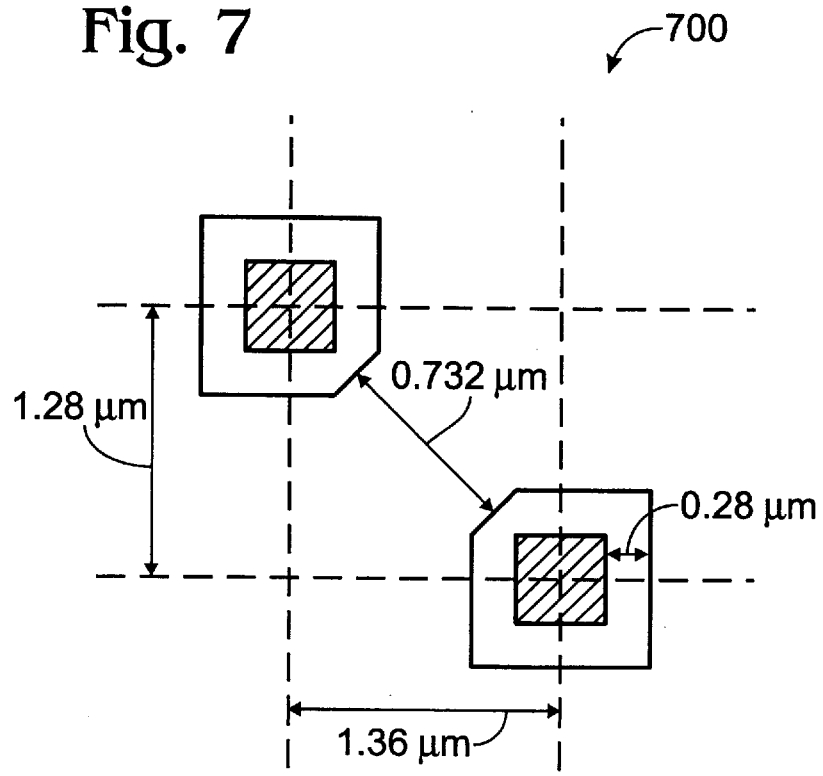
FIG. 7 is a diagram showing a plan view of the appearance of a via with an polygon shaped metal overlap in accordance with another embodiment of the invention.

FIG. 4 is a schematic diagram illustrating the positioning of two vias located diagonally with respect to one another, in which polygon metal overlaps with more than four sides, in this particular example, octagon overlaps, are employed. Of course, as illustrated in FIG. 7, other embodiments of polygon shaped via overlaps having more than four sides other than an octagon shape are within the scope of the invention. However, as illustrated by FIG. 4, the vias have been positioned successfully in the same manner as illustrated in FIG. 3, with the same spacing, although, by employing the octagon overlaps. In this particular example, the design rule has not been violated, because the diagonal distance between the metal overlaps is 0.732 microns in FIG. 4. Furthermore, the 0.28 microns metal overlap "rule" is not being violated even around the corners of the via. Therefore, the distance from the corner of the via diagonally to the edge of the octagon overlap is still at least 0.28 microns in this particular embodiment.

As this example illustrates, by employing an embodiment in accordance with the present invention, the density of routing may be improved so that more routing grids and more metal lines may be fit within a given chip area. As previously explained, this provides advantages in terms of cost, power, and design. It will, of course, be appreciated that although this embodiment has been illustrated where routing is employed between cells, the invention is not limited in scope in this respect, and, in alternative embodiments, this approach may likewise be employed for positioning vias with metal overlaps within a cell.

As previously described, typically computer-aided design (CAD) and computer-aided manufacturing (CAM) tools are employed in the design and fabrication of integrated circuit chips. Therefore, although embodiments of the invention may include fabricating an integrated circuit chip having some of the features previously described, and may also include an integrated circuit chip having some of the features previously described, likewise, in an alternative embodiment, a storage medium, such as a disk or hard drive, for example, may have stored thereon, instructions, such as instructions that may be executed by a computer or similar system, which, when executed, result in the placement and routing of vias between at least two connection points to be interconnected with metallization by positioning at least two vias diagonally with respect to one another, the at least two vias being positioned so each is capable of having a polygon shaped metal overlap with more than four sides. Typically, this particular embodiment of this invention may be employed in a CAD/CAM system that includes an APR tool, although the invention is not limited in scope in this respect.

Figure 5:
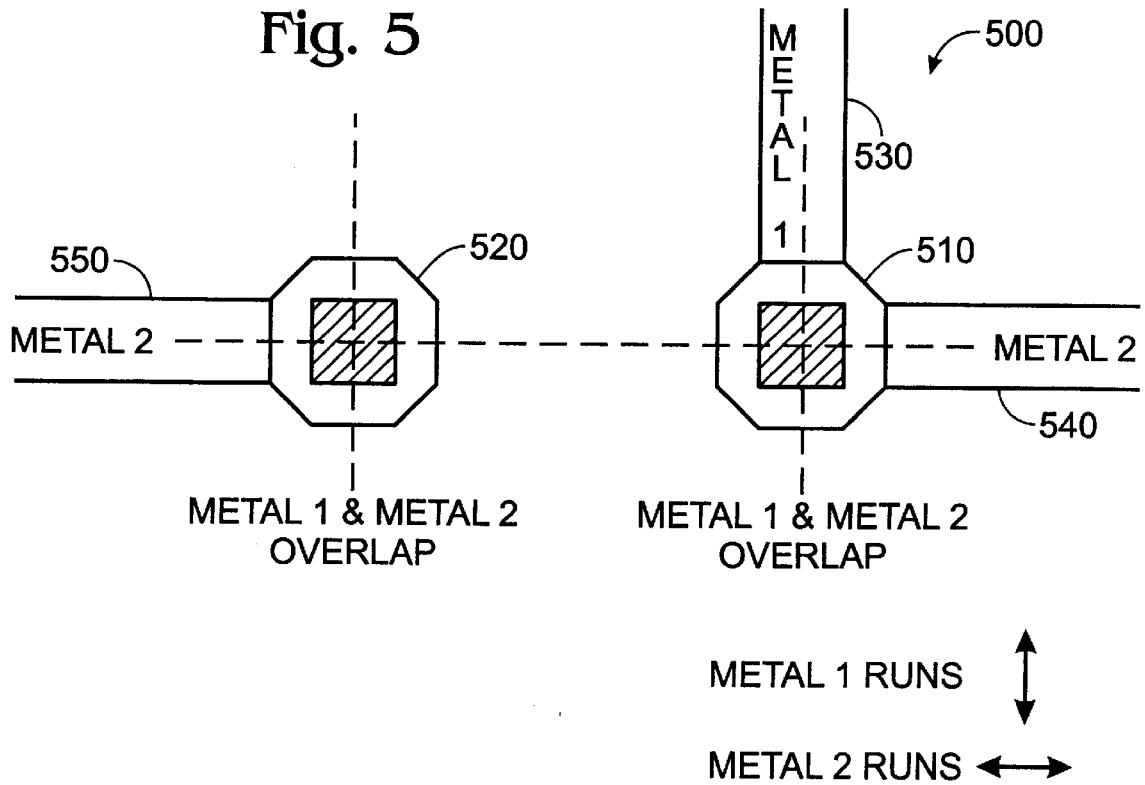
FIG. 5 is a diagram illustrating a plan view of two vias and first layer and second layer metal after fabrication in accordance with an embodiment of the invention.
Figure 6:
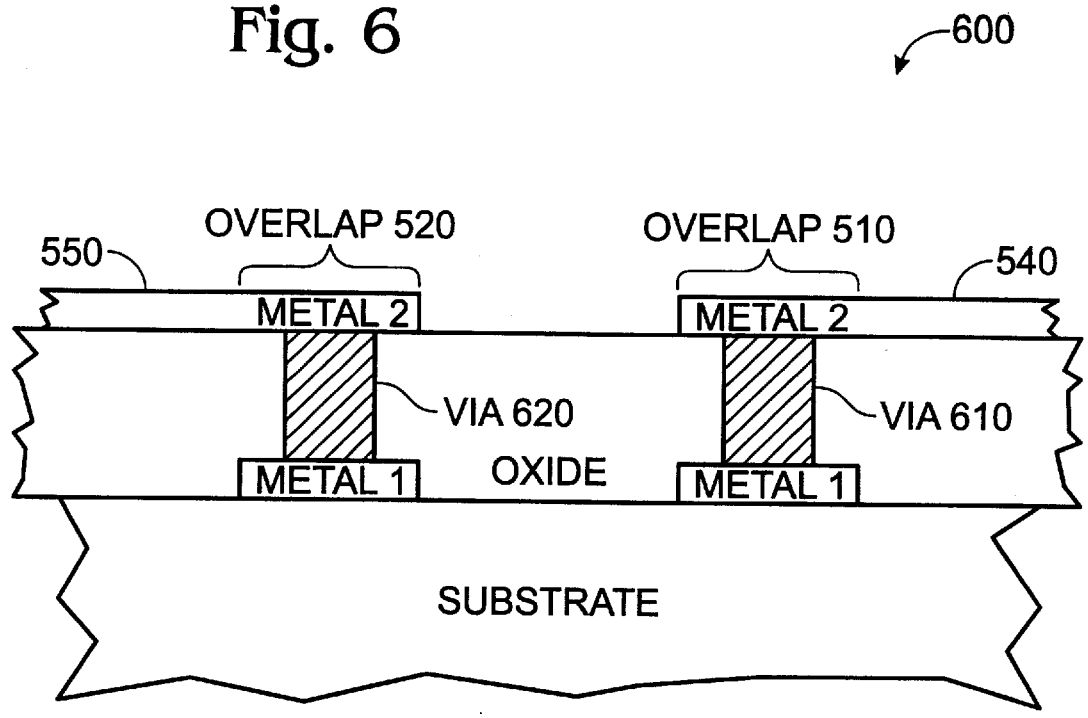
FIG. 6 is a diagram illustrating a side view of the two vias and first layer and second layer metal shown in FIG.5.

While FIG. 4 is a plan view of two vias that may be positioned by an APR tool, for example, FIGS. 5 and 6 illustrate the vias after fabrication. FIG. 5 is a plan view illustrating the location of the vias as well as metal1, or first layer metal, and metal2, or second layer metal. Of course, these diagrams are schematic in that it would not be possible to view both the metal1 and metal2 lines at one time. Likewise, FIG. 3 is a side view perspective of the vias. As illustrated, first layer metal runs horizontally in this embodiment and second layer metal runs vertically. Typically, an integrated circuit chip may include many layers of metal stacked above the semiconductor substrate in an interconnect portion.

While certain features of the invention have been illustrated and described herein, many modifications, substitutions, changes, and equivalents thereof will now occur to those skilled in the art. It is, therefore, to be understood that the appended claims are intended to cover all such modifications and changes as fall within the spirit of the invention.

What is claimed is:

1. An integrated circuit comprising:

a semiconductor substrate;

said semiconductor substrate having formed thereon an interconnect;

said interconnect including at least two vias, said at least two vias being located diagonally with respect to one another and each having a metal overlap with a polygon shape of more than four sides.

2. The integrated circuit of claim 1, wherein the polygon shape comprises an octagon shape.

3. The integrated circuit of claim 2, and wherein the location of the at least two vias prior to etching was positioned using an automatic placement and routing (APR) tool.

4. The integrated circuit of claim 2, wherein the at least two vias are located on a grid with respect to one another, the horizontal and vertical distances between the centers of the at least two vias being in the range of approximately 1 to 2 microns.

* * * * *